US007007333B1

(12) United States Patent
Mikhaylichenko et al.

(10) Patent No.: US 7,007,333 B1
(45) Date of Patent: Mar. 7, 2006

(54) SYSTEM AND METHOD FOR A COMBINED CONTACT AND NON-CONTACT WAFER CLEANING MODULE

(75) Inventors: Katrina Mikhaylichenko, San Jose, CA (US); Michael Ravkin, Sunnyvale, CA (US); John deLarios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 346 days.

(21) Appl. No.: 10/186,907

(22) Filed: Jun. 28, 2002

(51) Int. Cl.
*B08B 1/04* (2006.01)

(52) U.S. Cl. ........................................... 15/77; 15/88.3

(58) Field of Classification Search .................... 15/77, 15/88.3
See application file for complete search history.

(56) References Cited

U.S. PATENT DOCUMENTS 5,868,866 A 2/1999 Maekawa et al. ............ 134/34
5,976,267 A 11/1999 Culkins
6,041,465 A * 3/2000 Yashiki et al. .............. 15/88.3
6,059,888 A * 5/2000 Hillman ......................... 134/6
6,167,583 B1 * 1/2001 Miyashita et al. ............ 15/77
6,334,229 B1 1/2002 Monpour
6,385,805 B1 5/2002 Konishi
6,427,566 B1 * 8/2002 Jones et al. .................... 82/101
6,446,296 B1 * 9/2002 Middendorf et al. ........... 15/77
6,560,809 B1 * 5/2003 Atoh ........................... 15/102
6,622,334 B1 9/2003 Ziemins
2002/0029431 A1 * 3/2002 Oikawa et al. ................ 15/77
2002/0062842 A1 5/2002 Mikhaylich
2003/0111095 A1 6/2003 Sugarman

FOREIGN PATENT DOCUMENTS

JP 9-223681 * 8/1997
JP 11-176790 * 7/1999
JP 11-238713 * 8/1999

* cited by examiner

*Primary Examiner*—Mark Spisich
(74) *Attorney, Agent, or Firm*—Martine Penilla and Gencarella LLP

(57) ABSTRACT

A system and a method for cleaning and rinsing a wafer includes at least three rollers that are capable of supporting a wafer by an edge of the wafer. At least one of the rollers is driven and thereby capable of rotating the wafer. At least one of the rollers is a movable roller mounted on an actuator. The system and method also includes a first movable scrubbing roller capable of being moved away from and alternatively to the first side of the wafer. A second movable scrubbing roller capable of being moved away from and alternatively to a second side of the wafer is also included. The second side of the wafer opposes the first side of the wafer. The system and method also includes at least one first side nozzle directed toward the first side of the wafer and at least one second side nozzle directed toward the second side of the wafer.

13 Claims, 7 Drawing Sheets

SYSTEM AND METHOD FOR A COMBINED CONTACT AND NON-CONTACT WAFER CLEANING MODULE

CROSS REFERENCE TO RELATED APPLICATIONS

This application is related to U.S. Pat. No. 6,616,516 filed on Dec. 31, 2001, which issued on Sep. 9, 2003 and entitled "Method and Apparatus for Asymmetric Processing of Front Side and Backside of Semiconductor Substrates," which is incorporated herein by reference in its entirety.

BACKGROUND OF THE INVENTION

1. Field of the Invention

The present invention relates generally to semiconductor manufacturing processes, and more particularly, to methods and systems for cleaning semiconductor wafers.

2. Description of the Related Art

The fabrication of semiconductor devices involves numerous processing operations. These operations include, for example, impurity implants, gate oxide generation, inter-metal oxide depositions, metallization depositions, photolithography patterning, etching operations, chemical mechanical polishing (CMP), etc. As these operations generate particles and residue, there is a need to clean wafer surfaces, thus removing the contaminants such as adhered particles and adsorbed compounds (e.g., organic and metallic) from the surfaces of the wafer. Contaminants should be removed from wafer surfaces, as the existence of such contaminants has a detrimental effect on the performance of the integrated circuit devices.

Cleaning the front side (i.e., the active side or surface) of the wafer has traditionally been given higher priority in typical wafer cleaning systems and processes. This is because contaminants on the active side of the wafer can directly cause deleterious defects in the processing of the wafer. As wafer sizes have increased and/or feature sizes have decreased, certain shortcomings have been associated with lack of adequate and proper processing of the back side (i.e., non-active side) of wafers. One such limitation is the deviation of focal plane during the processing of wafers, which is specifically more pronounced during the photolithography-processing step.

By way of example, when a wafer is held on a vacuum or an electrostatic chuck, the presence of particle contaminants adhered to the wafer back side can cause the formation of high and low points throughout the wafer surface. As a result, the wafer surface is (locally) tilted or distorted, thus creating a focal plane deviation. This deviation, although very slight, can present a number of challenges in the photolithographic processes that form very small features.

In addition to creating focal plane deviation, the contaminant particles have proven to migrate from the back side to the wafer front side. For example, the migration may occur during a wet processing step and/or as the wafer is moved or otherwise handled between the processing or metrology tools. Further, the back side contaminants can also migrate from one process tool/step to contaminate subsequent processes.

In an attempt to eliminate such drawbacks, double-sided cleaning processing tools have been implemented. One of such double-sided tools is a brush scrubbing tool, which includes a pair of symmetrical brushes. FIGS. 1A and 1B illustrate two types of prior art, two sided wafer scrubbers. FIG. 1A shows a horizontally orientated, conventional wafer scrubber 100. FIG. 1B shows a vertically oriented, conventional wafer scrubber 100'. Both FIGS. 1A and 1B include a pair of brush cores 102*a* and 102*b* each having been mounted by a corresponding brush 104*a* and 104*b*. As shown, the outer surface of each of the brushes 104*a* and 104*b* is covered with numerous nodules 105*a* and 105*b*, respectively. However brushes 104*a*, 104*b* can also have a substantially smooth surface (i.e., without significant nodules 105*a*, 105*b*). In both orientations, a wafer 106 is scrubbed as the symmetrical brushes 104*a* and 104*b* rotate in a corresponding rotation direction of 108*a* and 108*b*.

As shown, the physical makeup of the brush cores 102*a* and 102*b* are identical. Similarly, the outer surfaces of the brushes 104*a* and 104*b* are constructed from the same material, thus having the same density and compressibility as well as surface contact areas with the wafer. Therefore, in both configurations of prior art wafer scrubbers, an identical amount of pressure is applied to each of the contact areas as the brushes 104*a* and 104*b* are respectively applied to the front and the back side of the wafer 106 with identical forces. Consequently, in prior art wafer scrubbers, the front side and the back side of the wafers are treated identically, even though only the front side of the wafer includes active components.

FIG. 1C shows a cross-section of a typical semiconductor wafer 150. The wafer has multiple layers 154–160 of material built up on a wafer substrate 152. A via 164 is shown etched through the layers 160, 158, 156 to expose a copper layer 154. Typical back side contaminants 170 are particles and byproducts from a previous process step are shown trapped between the wafer substrate 152 and an electrostatic chuck 180.

The conventional wafer cleaning systems require separate compartments or cleaning process tools for scrubbing and rinsing or a pre-scrubbing treatment. The separate cleaning tools are required because often a desired rinsing or pre-scrubbing solution may not be compatible with the material of the scrubbing rollers such as the scrub brushes 104*a*, 104*b*. The incompatible rinsing or pre-scrubbing solution may be desired to soften, loosen or dilute the contaminates to be removed from the wafer. A rinsing solution may also be applied to the wafer after the wafer has been scrubbed. For example, an aggressive pre-scrubbing solution may deteriorate the scrub brushes 104*a*, 104*b*. Therefore, multiple cleaning and rinsing processes and corresponding process tools are required to separate the use of the desired rinsing or pre-scrubbing solution from the scrub brushes 104*a*, 104*b* so as to not damage the scrub brushes 104*a*, 104*b*. The multiple cleaning process tools also require handling the wafer from one process tool to the next, which adds both complexity to the overall semiconductor manufacturing processes and also provides more opportunities for additional contaminants to be deposited on the wafer.

For example, after an etch process, the back side contaminants 170 can include ash and various polymer, particulate and other contaminants. The ash and various chemical contaminants can end up on the chuck 180, which then transfers them to the back side of the wafer 150. In another example, in a physical vapor deposition (PVD) process tool, copper or other metallic layers are deposited on all exposed surfaces inside the PVD tool. Therefore, the particles and chunks of the deposited material can become contaminants 170 on the surface of an electrostatic chuck within the PVD tool. When the next wafer is mounted on the electrostatic chuck 180, the particles and chunks can be transferred onto the backside of the wafer 150. Further, as the wafer is processed in the PVD tool, the particles become firmly attached to and even embedded in the backside of the wafer 150.

The attached particle contaminants and the chemical contaminants can require very aggressive cleaning solutions to effectively remove them from the back side of the wafer. However, the aggressive cleaning solutions may not be acceptable for use on the front side of the wafer. By way of example, if the contaminants 170 on the back side of the wafer 150 include copper or other metallic and polymer particles, contaminants and residue, then an aggressive, copper-reactive cleaning solution might be ideal for rapid and complete removal of the copper particles and residue in the contaminants 170. However, the front side of the wafer 150 may also have exposed copper, such as a copper line or exposed copper 154 at the bottom of via 164. The exposed copper 154 on the front side of the wafer must not be removed or damaged. Therefore, the ideal aggressive, copper-reactive cleaning solution cannot be used and a lesser aggressive cleaning solution must be used instead. As compared to the ideal aggressive, copper-reactive cleaning solution, the lesser aggressive cleaning solution may not fully remove the desired contaminant (i.e., copper), or may require additional cleaning steps, or may require extensive cleaning time to achieve the desired result. Further, while the back side of the wafer may require cleaning with an aggressive cleaning solution, the front side may also require cleaning but with a less aggressive solution. Conventional two side wafer scrubbers 100, 100' require the same cleaning solution be applied to both sides of the wafer.

In view of the foregoing, there is a need for a system and method of applying cleaning solutions to a wafer, inside a single wafer cleaning process that may not be compatible with the scrubbing rollers.

SUMMARY OF THE INVENTION

Broadly speaking, the present invention fills these needs by providing a system and method for cleaning and rinsing both sides of a wafer with solutions that may not be compatible with the scrubbing rollers. It should be appreciated that the present invention can be implemented in numerous ways, including as a process, an apparatus, a system, or a device. Several inventive embodiments of the present invention are described below.

One embodiment describes a system and a method for cleaning and rinsing a wafer includes at least three rollers that are capable of supporting a wafer by an edge of the wafer. At least one of the rollers can be driven and can thereby rotate the wafer. At least one of the rollers is a movable roller mounted on an actuator. The system and method also includes a first movable scrubbing roller capable of being moved away from and alternatively to the first side of the wafer. A second movable scrubbing roller is also included and can be moved away from, and alternatively, to a second side of the wafer is also included. The second side of the wafer opposes the first side of the wafer. The system and method also includes at least one first side nozzle directed toward the first side of the wafer and at least one second side nozzle directed toward the second side of the wafer.

The at least one first side nozzle can deliver a first solution to the first side of the wafer and the at least one second side nozzle can deliver a second solution to a second side of the wafer.

The first movable scrubbing roller can be moved away from the first side of the wafer such that the at least one first side nozzle is capable of supplying the first solution to the first side of the wafer without also applying the first solution to the first movable scrubbing roller.

The second movable scrubbing roller can be moved away from the second side of the wafer such that the at least one second side nozzle is capable of supplying the second solution to the second side of the wafer without also applying the second solution to the second movable scrubbing roller.

The second solution can also dilute the first solution. The second solution can include de-ionized water (DIW).

The at least one first side nozzle can also include a first megasonic transducer. The at least one second side nozzle can also include a second megasonic transducer.

In one embodiment, the first and second movable scrubbing rollers can apply different cleaning forces to the respective first and second sides of the wafer. The first and second movable scrubbing rollers can have different densities. The actuator can move the movable roller to or alternatively away from the edge of the wafer.

In one embodiment, supporting a wafer by an edge of the wafer can include supporting the wafer in at least one of a substantially vertical orientation and a substantially horizontal orientation.

In one embodiment, a method of cleaning and rinsing a wafer includes supporting a wafer between at least three rollers, rotating the wafer, applying a cleaning solution to a first side of the wafer, scrubbing the first side of the wafer with a first scrubbing roller, applying a second solution to a second side of the wafer, the second side of the wafer opposing the first side of the wafer and scrubbing the second side of the wafer with a second scrubbing roller.

The first scrubbing roller can also be moved away from the first side of the wafer and the second scrubbing roller can be moved away from the second side of the wafer. A third solution is applied to the first side of the wafer and a fourth solution is applied to a second side of the wafer.

In one embodiment, megasonic energy can be applied to at least one of the third solution and the fourth solution.

The system and method for rinsing and cleaning a wafer provides the advantage of being able to rinse and clean a wafer within one process tool. Another advantage is that the scrubbing rollers can be moved away from the wafer, without moving the wafer and a solution that is incompatible with the scrubbing rollers can be applied to the wafer. This allows more flexible processes without requiring additional rinsing or cleaning process tools or additional handling and transport of the wafer.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments of systems and method for cleaning and rinsing both sides of a semiconductor wafer will now be described. It will be apparent to those skilled in the art that the present invention may be practiced without some or all of the specific details set forth herein.

As discussed above, cleaning a wafer is required in many points in the overall semiconductor manufacturing processes. The semiconductor manufacturing processes are being constantly driven to increase throughput and streamline (i.e., reduce) manufacturing processes and to achieve these goals while also achieving increased feature density and reduced waste. The present invention describes several approaches to simplify the wafer cleaning processes while also providing a more versatile cleaning process.

Supporting a Wafer

Figure 1B:
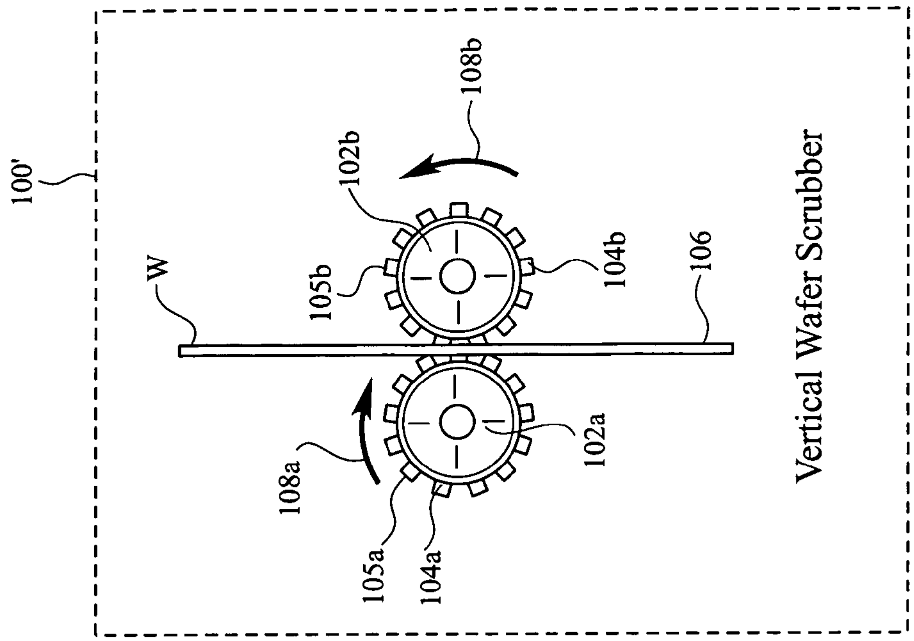
FIG. 1B shows a vertically oriented, conventional wafer scrubber.
Figure 1A:
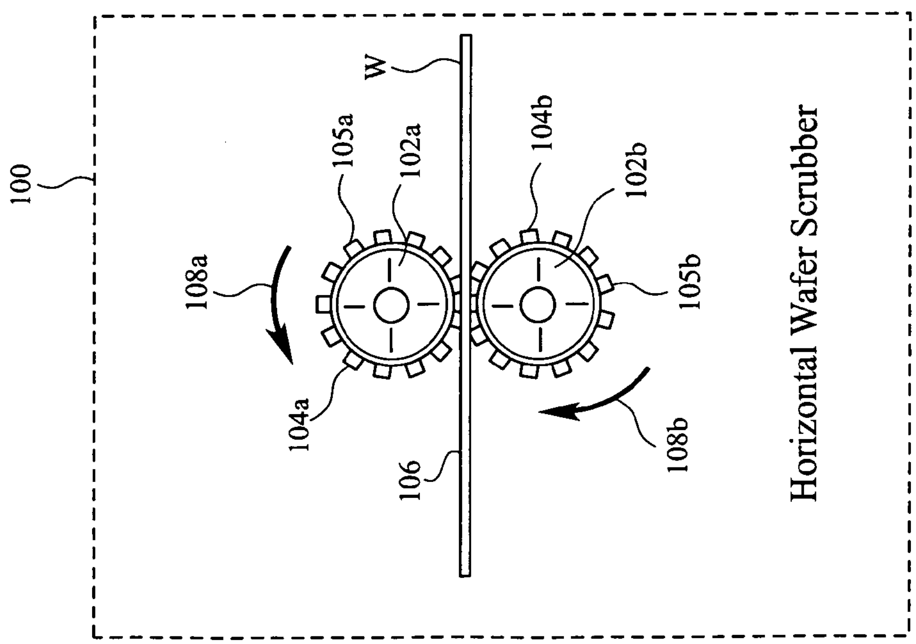
FIG. 1A shows a horizontally orientated, conventional wafer scrubber.
Figure 1C:
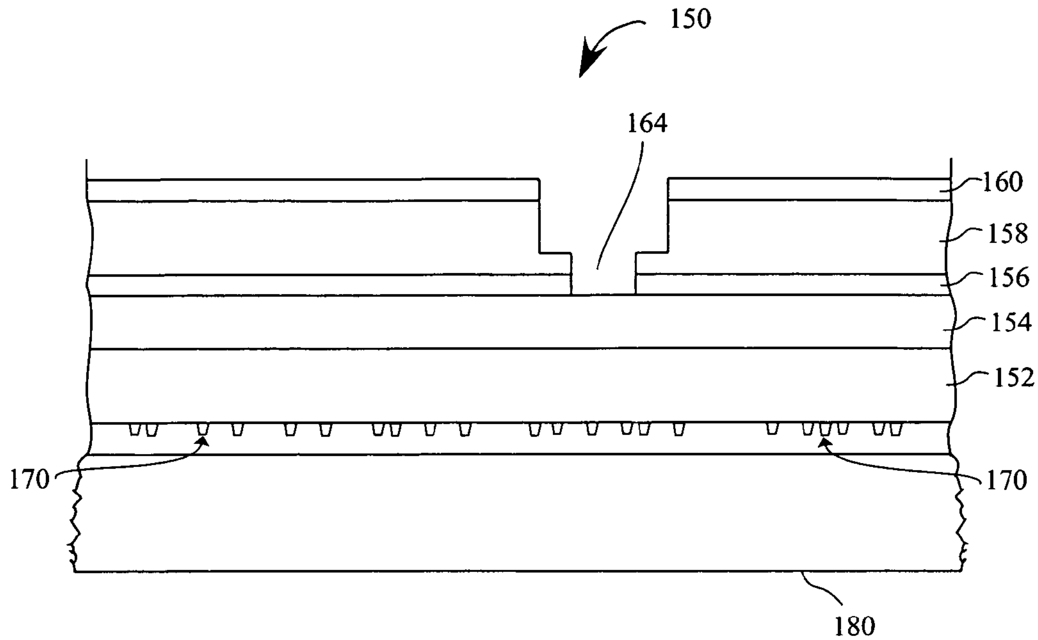
FIG. 1C shows a cross-section of a typical semiconductor wafer.
Figure 2A:
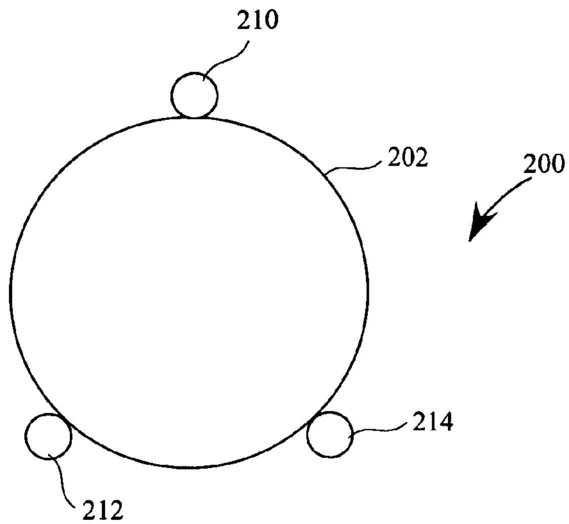
FIG. 2A shows a system for supporting a wafer in accordance with one embodiment of the present invention.

FIG. 2A shows a system 200 for supporting a wafer 202 in accordance with one embodiment of the present invention. A wafer 202 is shown being supported by three points 210, 212, 214. The three points 210, 212, 214 can be pins or fingers such as on a robot arm or rollers or other holding devices. The three points can be equally spaced along the circumference of the wafer 202 or alternatively may not be equally spaced as shown.

In one embodiment the system 200 also allows the wafer 202 to be rotated. By way of example, if the three points 210, 212, 214 are rollers, then the rollers can support the wafer 202 by the edge of the wafer while allowing the wafer 202 to be rotated.

Figure 2B:
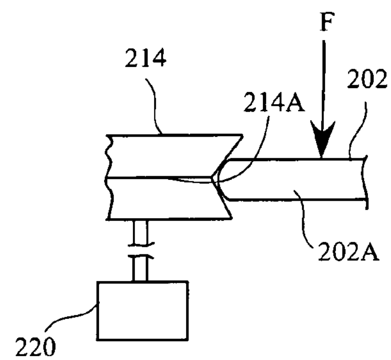
FIG. 2B shows a cross-section of the wafer and a roller of FIG. 2A in accordance with one embodiment of the present invention.

FIG. 2B shows a cross-section of the wafer 202 and a roller 214 of FIG. 2A in accordance with one embodiment of the present invention. The roller 214 can include a groove 214A that can accept the edge 202A of the wafer 202. Only contacting the edge 202A of the wafer 202 allows the contact area between the roller 214 and the edge 202A to be minimized. Minimizing the contact area between the wafer and the rollers 210, 212, 214 allows for a narrower exclusion zone (i.e., unused or unusable geography) on the front side of the wafer 202, thereby providing greater area on the front side of the wafer 202 that can be used for semiconductor device structures. Minimizing the contact area between the rollers 210, 212, 214 and the edge 202*a* of the wafer 202 can also substantially reduce the migration of a cleaning solution from one side of the wafer to the other side of the wafer by way of the rollers 210, 212, 214.

One or more roller, such as the roller 214, can also be coupled to a drive system 220 that can cause the roller 214 to rotate. In turn, the rotating roller 214 can then cause the wafer 202 to rotate. The remaining rollers 210, 212 can be bearings that both support the wafer 202 while allowing the wafer 202 to rotate. The wafer 202 can be rotated within a range of between about 3 to about 500 rpm. A range of about 5 to about 40 rpm wafer rotation is preferable and about 20 rpm wafer rotation is most preferable in some embodiments. The desirability of a particular wafer rotation speed is determined by the particular requirements of the process as will be described in more detail below.

The groove 214A allows the roller 214 to securely grip and center the edge 202A of the wafer 202 so as to keep the wafer 202 centered in the roller 214. For example, a groove in each of the rollers 210, 212, 214 would keep the wafer 202 aligned in a single plane between the three rollers 210, 212, 214. Additionally, if a force F is exerted onto one side of the wafer 202, then the groove in each of the rollers 210, 212, 214 would hold the wafer 202 without allowing significant deviation in the single plane between the three rollers 210, 212, 214.

Figure 3:
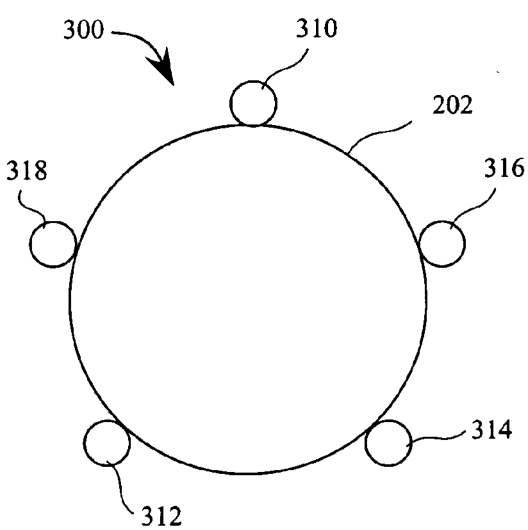
FIG. 3 shows a system for supporting a wafer in accordance with one embodiment of the present invention.

FIG. 3 shows a system 300 for supporting a wafer 202 in accordance with one embodiment of the present invention. The system 300 includes more than three points that can support the wafer 202. While five points 310, 312, 314, 316, 318 are shown, more or less points could also be used without deviating from the invention as conceived.

Figure 4:
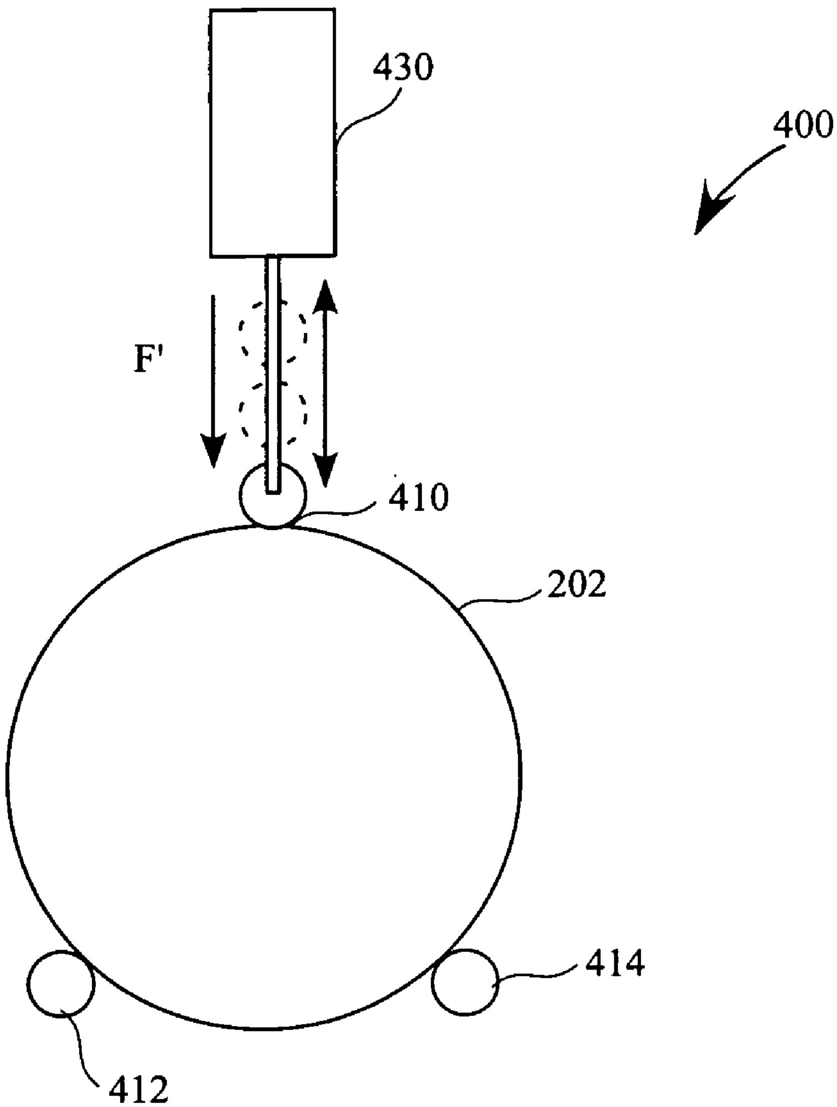
FIG. 4 shows another system for supporting a wafer in accordance with one embodiment of the present invention.

FIG. 4 shows another system 400 for supporting a wafer 202 in accordance with one embodiment of the present invention. The system includes three rollers 410, 412, 414 in contact with the edge of the wafer 202. Additional rollers could also be included as described above in FIG. 3. At least one roller 410 can be attached to an actuator 430 so that the roller 410 can be moved to and away from the wafer 202 so as to allow a wafer 202 to be placed between the rollers 410, 412, 414, such as by an end effector on a robot arm. Once the wafer is properly located between the rollers 410, 412, 414, the actuator 430 can be activated to move the roller 410 into contact with the wafer 202 to securely hold the wafer 202. The actuator 430 can be linear or rotary or any other type of actuator capable of moving the roller 410 toward and away from the edge of the wafer 202. Further, the actuator 430 can be hydraulic, pneumatic, electrical or otherwise powered to move the roller 410 to and away from the edge of the wafer 202.

In one embodiment, the actuator 430 can apply a variable force F' to the edge 202A of the wafer 202. It may be necessary to apply force F' to the edge of the wafer 202 to counteract a force (or forces), such as force F shown in FIG. 2B above, applied to either one or both surfaces of the wafer 202 such as by a scrubbing roller applied to one or both sides of the wafer 202. By way of example, a force F' counteracting force F, in FIG. 2B above, can be applied to the edge of the wafer 202 by the actuator 430 through the roller 410 and thereby maintain a secure hold on the wafer 202. Force F can be with a range of about 1 psi to about 20 psi. Typically, force F is about 7 psi.

Properly supporting the wafer 202 can directly impact the success of subsequent processes that may be applied to the wafer 202 such as scrubbing or rinsing the wafer.

Applying a Solution to the Wafer

Various solutions may be applied to a wafer 202 such as a rinsing solution (e.g., de-ionized water (DIW)) for rinsing residue from a previous process from the wafer. Somewhat more aggressive cleaning solutions for cleaning residue from a previous process may also be applied. The cleaning solutions can include, for example, Standard Clean 1 (SC1), a base ammonia (e.g., $NH_4OH$), hydrofluoric acid (HF), proprietary cleaning solutions from EKC of Hayward, Calif. which are commonly known as EKC 6800, EKC 1800, sulfuric acid or any additional solutions as may be necessary.

For more information on wafer cleaning systems and techniques and exemplary solutions used therein, reference may be made to commonly owned U.S. Pat. No. 5,858,109, filed Jan. 31, 1997, entitled "Method And Apparatus For Cleaning Of Semiconductor Substrates Using Standard Clean 1 (SC1)," which is a continuation-in-part application of U.S. patent application Ser. No. 08/542,531, filed Oct. 13, 1995, entitled "Method and Apparatus for Chemical Delivery Through the Brush." Both the U.S. patent and the application are hereby incorporated by reference.

Figure 5:
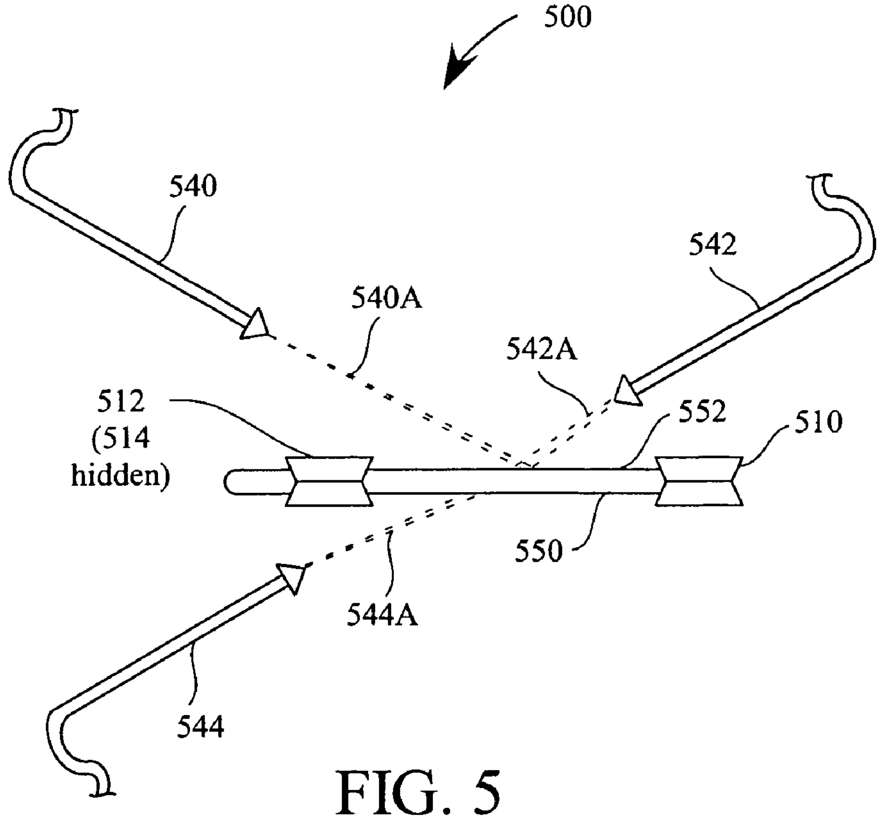
FIG. 5 shows a wafer rinsing system according to one embodiment of the present invention.

FIG. 5 shows a wafer rinsing system 500 according to one embodiment of the present invention. The wafer rinsing system 500 includes three rollers 510, 512, 514 (hidden) that can hold the edge of the wafer 202. The wafer rinsing system 500 also includes multiple nozzles 540, 542, 544. Additional nozzles (not shown) can also be included. The nozzles 540, 542, 544 can be directed toward one or both sides 550, 552 of the wafer 202. Rinsing and/or pre-scrubbing and/or cleaning solutions can be applied to the wafer 202 through the multiple nozzles 540, 542, 544. In one embodiment, the multiple nozzles 540, 542, 544 can spray solutions such as rinsing and/or pre-scrubbing and/or cleaning solutions in a relatively thin spray that fans outward onto the one or more sides 550, 552. The sprayed solutions can provide some measure of mechanical cleaning force. By way of example, if the solution is delivered to the nozzle under pressure of between about 5 psi and about 50 psi, then the fan shape sprayed on the one or more sides 550, 552 may be able to loosen and remove some material on the one or more sides 550, 552. Alternatively, the nozzles 540, 542, 544 can deliver the solutions at a relatively low pressure such that the solutions gently drip or flow onto the one or more sides 550, 552 of the wafer 202.

In one embodiment, the nozzles 540, 542, 544 can move or scan across the wafer 202 such as with actuators or other systems for moving the nozzles 540, 542, 544. Moving the nozzles 540, 542, 544 allows the sprayed solution to sweep across the one or more sides 550, 552. In one embodiment, the nozzles are directed toward the center of the wafer 202 so that the solution is distributed across the one or more sides 550, 552 as the wafer rotates.

In one embodiment, the nozzles 540, 542, 544 are angled at an acute angle (i.e. less than 90 degrees) relative to the one or more sides 550, 552. The acute angle assists the mechanical energy provided by the sprayed solution to move any loosened contaminants from the one or more sides 550, 552.

The wafer 202 can be rotated by the rollers 510, 512, 514 as a cleaning solution is sprayed onto the wafer 202 so that the cleaning solution is evenly distributed. The film thickness of the resulting layer of cleaning solution applied to the wafer 202 is dependant upon the rotational speed of the wafer 202. For example, if the wafer is relatively rapid (i.e., greater than about 200 RPM) the cleaning solution is very thinly spread upon the wafer surface.

Figure 6:
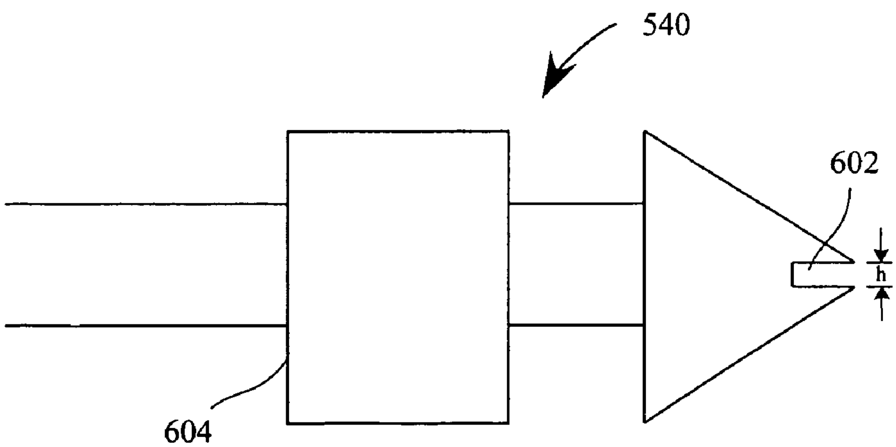
FIG. 6 shows a detail of one nozzle according to one embodiment of the present invention.

FIG. 6 shows a detail of a nozzle 540 according to one embodiment of the present invention. The nozzle 540 includes an opening 602. The opening 602 can be within the range of about 0.5 to about 3.0 mm in height h and a width as wide as necessary to produce the desired width of the spray pattern.

In one embodiment, the nozzle 540 can also include a megasonic transducer 604. The megasonic transducer can impart megasonic energy to the solution sprayed from the nozzle 540. The megasonic energy in the solution can further enhance the mechanical force of the sprayed solution. Megasonic energy can include a range of about 1 to about 15 watts/square centimeter average and typically in a range of 8 to about 10 watts/square centimeter. Megasonic energy can be within a range of about 500 kHz to about 1.5 MHz.

The various techniques and systems for applying solutions to the surfaces of the wafer 202 enhance the subsequent and sometimes concurrent processes applied to the wafer.

Combined Two-Side Cleaning and Rinsing

As discussed in the above, conventional wafer cleaning systems can require separate compartments or cleaning process tools for scrubbing and rinsing or a pre-scrubbing treatment. This is specifically true where the solutions used in rinsing or pre-scrubbing the wafer is incompatible with the material of scrubbing rollers to be used.

Figure 7:
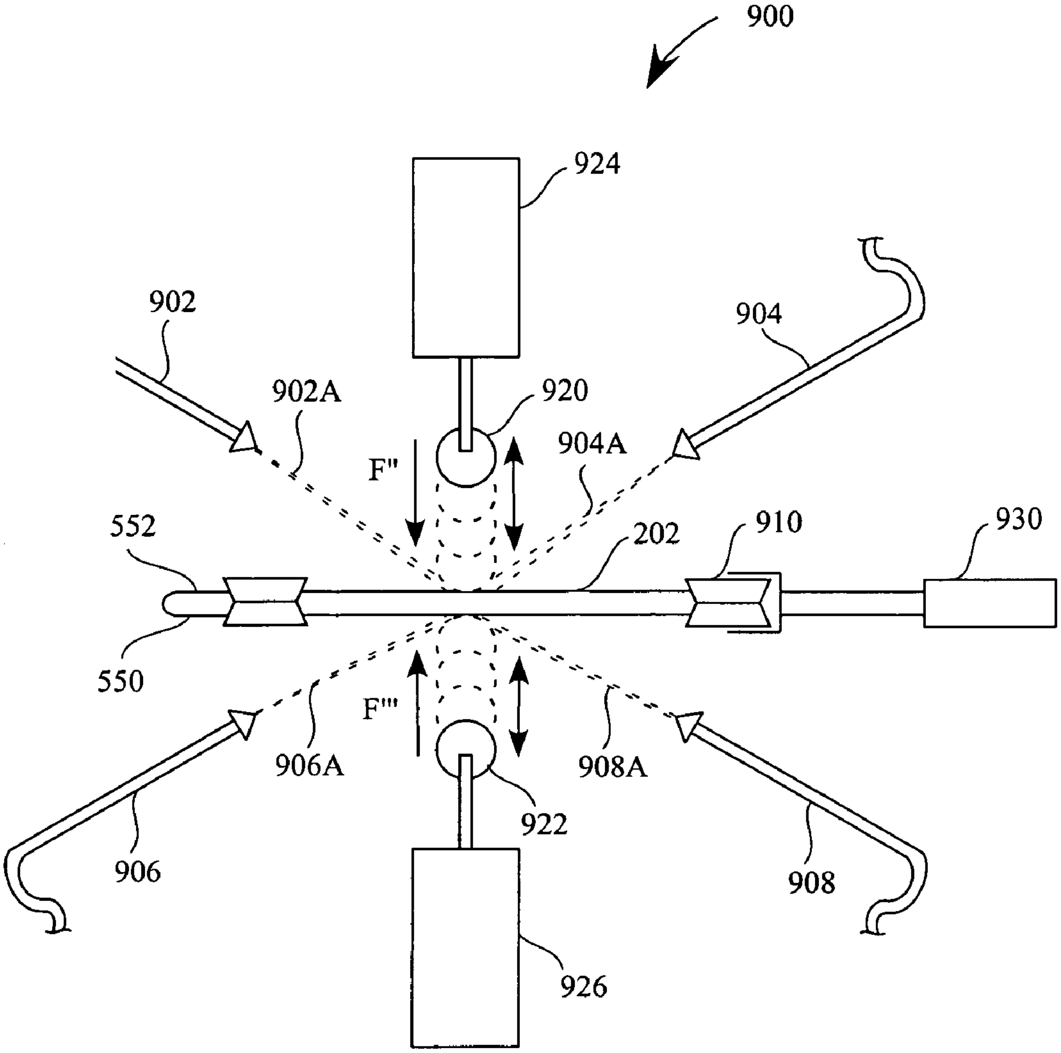
FIG. 7 shows a combination wafer cleaning and rinsing system in accordance

FIG. 7 shows a combination wafer cleaning and rinsing system 900 in accordance with one embodiment of the present invention. The cleaning system 900 includes multiple nozzles 902, 904 directed toward a front side 552 of a wafer 202 and multiple nozzles 906, 908 directed toward a back side 550 of the wafer 202. The cleaning system 900 also includes at least one movable scrubbing roller 920 that can be moved into contact with the front side 552 of the wafer. The movable scrubbing roller 920 is attached to an actuator 924 that can move or retract the scrubbing roller 920 away from and toward the front side 552 of the wafer 202. The actuator 924 can also be used to apply a force F" to the front side 552 of the wafer 202. The cleaning system 900 also includes at least one movable scrubbing roller 922 that can be moved into contact with the back side 550 of the wafer. The movable scrubbing roller 922 is attached to an actuator 926 that can move or retract the scrubbing roller 922 away from and toward the back side 550 of the wafer 202. The actuator 926 can also be used to apply a force F'" to the back side 550 of the wafer 202.

The cleaning system 900 can also include multiple rollers 910, 912, 914 (hidden) that can hold the edge of the wafer 202. At least one roller 910 can be attached to an actuator 930 so that the roller 910 can be moved away from the wafer 202 so as to allow a wafer 202 to be placed between the rollers 910, 912, 914, such as by an end effector on a robot arm. Once the wafer is properly located between the rollers 910, 912, 914, the actuator 930 can be activated to move the roller 910 into contact with the wafer 202 to securely hold the wafer 202 between the rollers 910, 912, 914.

The actuators 924, 926 can be linear or rotary or any other type of actuator capable of moving the scrubbing rollers 920, 922 toward and away from the respective sides 552, 550 of the wafer 202. Further, the actuators 924, 926 can be hydraulic, pneumatic, electrical or otherwise powered to move the scrubbing rollers 920, 922 toward and away from the respective sides 552, 550 of the wafer 202. In addition, the actuator 930 can apply a variable force F' to the edge of the wafer 202. It may be necessary to apply force F' to the edge of the wafer 202 to counteract a force (or forces) such as F" and F'" applied to either one or both sides of the wafer 202.

The nozzles 902, 904, 906, 908 can be at any angle as needed to spray the respective sides 552, 550 of the wafer 202 without also spraying the scrubbing rollers 920, 922. In one embodiment, nozzles 902, 904 form an angle of between about 10 degrees to about 80 degrees with the front side 552 of the wafer 202. Similarly, nozzles 906, 908 form an angle of between about 10 degrees to about 80 degrees with the back side 550 of the wafer 202. Each of the nozzles 902, 904, 906, 908 can form a different angle with the respective sides 552, 550 of the wafer 202. While four nozzles 902, 904, 906, 908 are shown, additional or fewer nozzles can also be used without deviating from the present invention.

In at least one embodiment, the movable scrubbing rollers 920, 922 can be moved away from the wafer 202 such that the nozzles 902, 904, 906, 908 can spray solutions on the respective sides 552, 550 of the wafer 202 without also spraying the same solution on the scrubbing rollers 920, 922. In this manner the wafer can be rinsed or have other solutions that are not compatible with the scrubbing rollers 920, 922 sprayed on the wafer 202 and then the wafer can be scrubbed without necessitating moving the wafer to another cleaning tool or brush box.

Scrubbing rollers 920, 922 can apply differing amounts of force to the respective sides of the wafer 202 (i.e., F" is not equal to F'") and the rollers 910, 912, 914 can support the wafer 202. In an alternative embodiment, the scrubbing rollers 920, 922 can have different densities such as described in commonly owned U.S. Pat. No. 6,616,516 filed on Dec. 31, 2001, which issued on Sep. 9, 2003, and entitled "Method and Apparatus for Asymmetric Processing of Front Side and Backside of Semiconductor Substrates," which is incorporated herein by reference in its entirety for all purposes. If the scrubbing rollers 920, 922 can have different densities, then each of the scrubbing rollers 920, 922 will have a different contact area with the same applied force (i.e., F" is equal to F'"). Because each of the scrubbing rollers 920, 922 will have a different contact area, the actual scrubbing force per a given unit of area (e.g., psi, $kg/cm^2$). This results in a significantly harder scrubbing on the one side of the wafer 202 having a higher density scrubbing roller as compared to a relatively softer scrubbing on the opposing side of the wafer 202 having a lower density scrubbing roller.

The scrubbing rollers 920, 922 can be rotated at a rate of between about 20 and about 300 rpm. In one embodiment, the scrubbing rollers 920, 922 rotate at about 120 rpm. In one embodiment, the scrubbing rollers 920, 922 rotate at the same rate. Alternatively, the scrubbing rollers 920, 922 can rotate at different rates. By way of example, scrubbing roller 920 can rotate at a rate of 120 rpm while scrubbing roller 922 rotates at a rate of 200 rpm. In one embodiment, the scrubbing rollers 920, 922 rotate in opposite directions or alternatively in the same direction.

Figure 8:
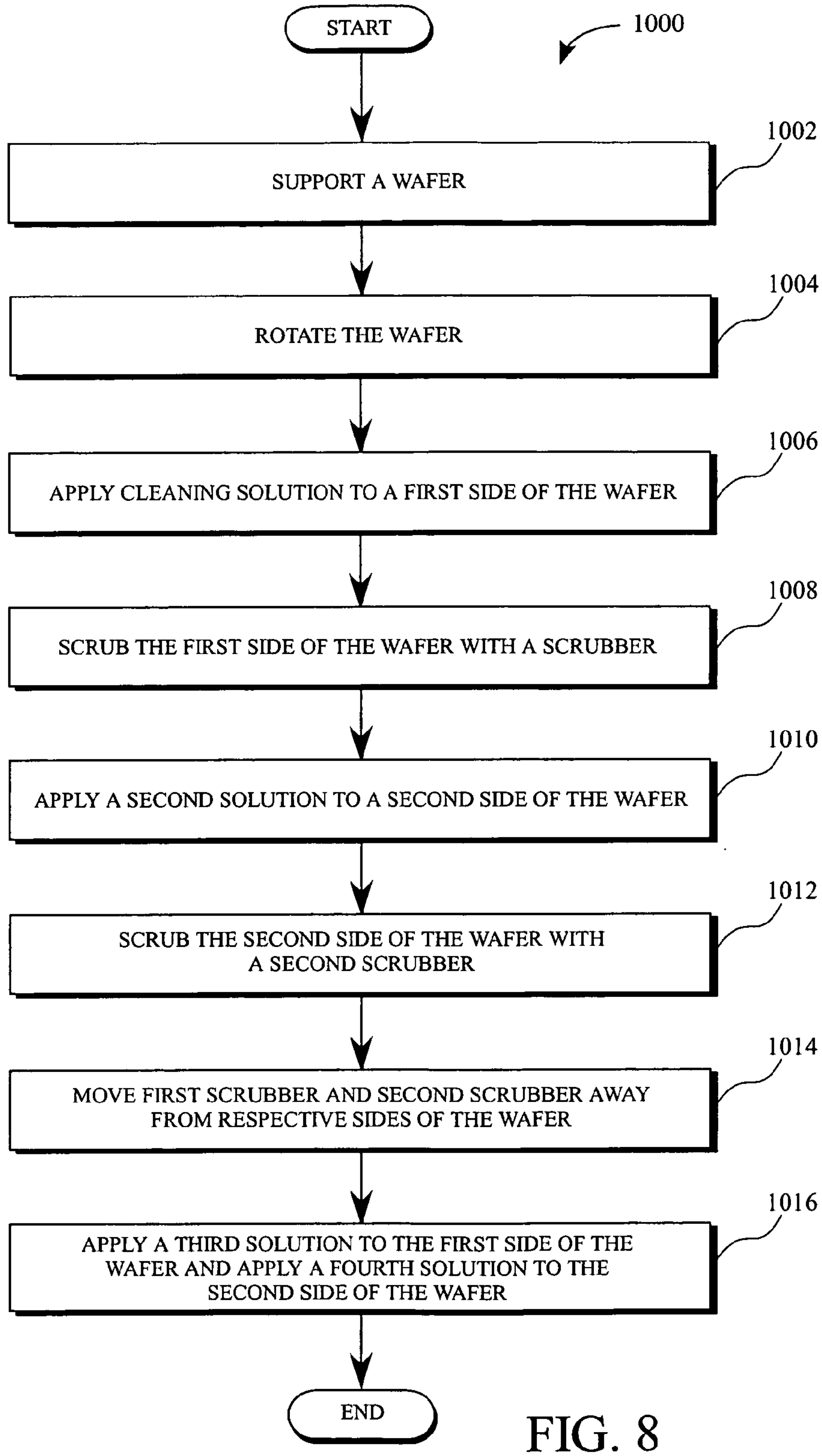
FIG. 8 is a flowchart of the method operations of a combined wafer cleaning and rinsing process in accordance with one embodiment of the present invention.

FIG. 8 is a flowchart of the method operations of a combined wafer cleaning and rinsing process 1000 in accordance with one embodiment of the present invention. In operation 1002 a wafer is supported between at least three rollers or other points such as described above. The wafer is rotated in operation 1004 such as by at least one of the rollers. A cleaning solution is applied to a first side of the wafer in operation 1006. The cleaning solution can be applied through a scrubbing roller (e.g., a saturated scrubbing roller or pumped through the scrubbing roller) or delivered directly to the first side of the wafer such as by drip or spray or a flow onto the first side of the wafer.

The first side of the wafer is scrubbed with a first scrubbing roller in operation 1008. A second solution is applied to a second side of the wafer in operation 1010. The second solution can be applied through a scrubbing roller (e.g., a saturated scrubbing roller or pumped through the scrubbing roller) or delivered directly to the second side of the wafer such as by drip or spray or a flow onto the second side of the wafer. The second side of the wafer is scrubbed with a second scrubbing roller in operation 1012.

In operation 1014, the first scrubbing roller and the second scrubbing roller are moved away from the respective sides of the wafer. In operation 1016, a third solution can be applied to the first side of the wafer and a fourth solution can be applied to the second side of the wafer. The first and second scrubbing rollers can be moved sufficiently away from the respective sides of the wafer that the third solution and the fourth solution will not be applied to the scrubbing rollers as the third solution and the fourth solution are being applied to the first and second sides of the wafer.

In the various embodiments described above, one skilled in the art would recognize that the cleaning systems can be arranged such that the wafer can be oriented in either the horizontal or vertical orientation without departing from the intended invention as described.

As used herein the term "about" when used to modify a number or a range of numbers includes a range of +/−10% of the stated number or range.

It will be further appreciated that the instructions represented by the operations in FIG. 8 are not required to be performed in the order illustrated, and that all the processing represented by the operations may not be necessary to practice the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for cleaning and rinsing a wafer comprising:

at least three edge rollers, the at least three edge rollers being capable of supporting a wafer by an edge of the wafer, at least one of the edge rollers being driven and thereby capable of rotating the wafer and at least one of the edge rollers is a movable roller mounted on an edge roller actuator being capable of applying a variable force to the edge of the wafer through the at least one movable edge roller;

a first actuator;

a second actuator;

a first movable scrubbing roller mechanically coupled to the first actuator, the first movable scrubbing roller capable of being moved away from and alternatively to a first side of the wafer by the first actuator;

a second movable scrubbing roller mechanically coupled the second actuator, the second movable scrubbing roller capable of being moved away from and alternatively to a second side of the wafer by the second actuator, the second side of the wafer opposing the first side of the wafer, wherein the first actuator applies a first force through the first movable scrubbing roller to the first side of the wafer, the first force being substantially perpendicular to the first side of the wafer and the second actuator applies a second force through the second movable scrubbing roller to the second side of the wafer, the second force being substantially perpendicular to the second side of the wafer, wherein a differential force is equal to a difference between the first force and the second force, wherein the edge roller actuator is operatively coupled to the first actuator and the second actuator such that the variable force counteracts the differential force when the differential force is greater than zero;

at least one first side nozzle directed toward the first side of the wafer; and at least one second side nozzle directed toward the second side of the wafer.

2. The system of claim 1, wherein the at least one first side nozzle is capable of delivering a first solution to the first side of the wafer and the at least one second side nozzle is capable of delivering a second solution to the second side of the wafer.

3. The system of claim 2, wherein the first movable scrubbing roller is capable of being moved away from the first side of the wafer such that the at least one first side nozzle is capable of supplying the first solution to the first side of the wafer without also applying the first solution to the first movable scrubbing roller.

4. The system of claim 2, wherein the second movable scrubbing roller is capable of being moved away from the second side of the wafer such that the at least one second side nozzle is capable of supplying the second solution to the second side of the wafer without also applying the second solution to the second movable scrubbing roller.

5. The system of claim 2, wherein the second solution is capable of diluting the first solution.

6. The system of claim 2, wherein the second solution is one of a group of chemicals consisting of de-ionized water (DIW).

7. The system of claim 1, wherein the at least one first side nozzle includes a first megasonic transducer and the at least one second side nozzle includes a second megasonic transducer.

8. The system of claim 1, wherein the at least one first side nozzle is capable of scanning a stream of a first cleaning solution across the first side of the wafer.

9. The system of claim 1, wherein the at least one second side nozzle is capable of scanning a stream of a second cleaning solution across the second side of the wafer.

10. The system of claim 1, wherein the first and second movable scrubbing rollers have different densities.

11. The system of claim 1, wherein the edge roller actuator is capable of moving the movable roller to or alternatively away from the edge of the wafer.

12. The system of claim 1, wherein supporting a wafer by an edge of the wafer includes supporting the wafer in a substantially vertical orientation.

13. The system of claim 1, wherein supporting a wafer by an edge of the wafer includes supporting the wafer in a substantially horizontal orientation.

* * * * *